(12) United States Patent
Sankman et al.

(10) Patent No.: US 11,410,919 B2
(45) Date of Patent: Aug. 9, 2022

(54) STACKED SILICON DIE ARCHITECTURE WITH MIXED FLIPCIP AND WIREBOND INTERCONNECT

(71) Applicant: Intel Corporation, Santa Clara, CA (US)

(72) Inventors: Robert L. Sankman, Phoenix, AZ (US); Sanka Ganesan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/645,744

(22) PCT Filed: Dec. 30, 2017

(86) PCT No.: PCT/US2017/069157
§ 371 (c)(1),
(2) Date: Mar. 9, 2020

(87) PCT Pub. No.: WO2019/133019
PCT Pub. Date: Jul. 4, 2019

(65) Prior Publication Data
US 2020/0273783 A1    Aug. 27, 2020

(51) Int. Cl.
*H01L 23/498* (2006.01)
*H01L 21/48* (2006.01)
(Continued)

(52) U.S. Cl.
CPC ........ *H01L 23/49811* (2013.01); *H01L 21/48* (2013.01); *H01L 23/3121* (2013.01);
(Continued)

(58) Field of Classification Search
CPC .............. H01L 23/49811; H01L 21/48; H01L 23/3121; H01L 23/49861; H01L 24/13;
(Continued)

(56) References Cited

U.S. PATENT DOCUMENTS 7,829,990 B1    11/2010 Scanlan et al.
8,125,066 B1    2/2012 Kang
(Continued)

OTHER PUBLICATIONS

International Preliminary Report on Patentability for International Patent Application No. PCT/US2017/069157, dated Jul. 9, 2020, 11 pgs.
(Continued)

*Primary Examiner* — Douglas W Owens
(74) *Attorney, Agent, or Firm* — Schwabe, Williamson & Wyatt, P.C.

(57) ABSTRACT

Embodiments include semiconductor packages and a method of forming the semiconductor packages. A semiconductor package includes a base die disposed on an interposer. The semiconductor package also has a plurality of dies on top of one another to form a stack on the base die. Each die has a top surface and a bottom surface that is opposite from the top surface, and each die has one or more die contacts on at least one of the top surface and the bottom surface that are each electrically coupled to at least one die contact of the base die with one or more wire bonds. The semiconductor package includes a mold layer disposed over and around the plurality of dies, the base die, and the one or more wire bonds. The base die may have a first surface area that exceeds a second surface area of the plurality of stacked dies.

27 Claims, 4 Drawing Sheets

(51) Int. Cl.
*H01L 23/31* (2006.01)
*H01L 23/00* (2006.01)
*H01L 25/065* (2006.01)
*H01L 25/00* (2006.01)

(52) U.S. Cl.
CPC ........ *H01L 23/49861* (2013.01); *H01L 24/13* (2013.01); *H01L 24/45* (2013.01); *H01L 24/73* (2013.01); *H01L 24/81* (2013.01); *H01L 25/0657* (2013.01); *H01L 25/50* (2013.01)

(58) Field of Classification Search
CPC ......... H01L 24/45; H01L 24/73; H01L 24/81; H01L 25/0657; H01L 25/50
See application file for complete search history.

(56) References Cited

U.S. PATENT DOCUMENTS

| | | | | |
|---|---|---|---|---|
| 2011/0048773 | A1* | 3/2011 | Kaneko | H05K 3/22 174/257 |
| 2011/0079890 | A1* | 4/2011 | Song | H01L 24/83 257/686 |
| 2012/0098115 | A1* | 4/2012 | Watanabe | H01L 25/0657 257/690 |
| 2012/0153468 | A1* | 6/2012 | Lee | H01L 25/0657 257/737 |
| 2012/0241925 | A1* | 9/2012 | Yoon | H01L 21/563 257/666 |
| 2014/0021605 | A1* | 1/2014 | Yu | H01L 25/50 257/738 |
| 2014/0252640 | A1* | 9/2014 | Kwak | H01L 23/5381 257/773 |
| 2015/0123289 | A1* | 5/2015 | Park | H01L 25/50 257/777 |
| 2015/0357319 | A1* | 12/2015 | Yu | H01L 23/36 438/107 |
| 2019/0051627 | A1* | 2/2019 | She | H01L 24/48 |
| 2019/0371766 | A1* | 12/2019 | Liu | H01L 24/48 |

OTHER PUBLICATIONS

International Search Report and Written Opinion for International Patent Application No. PCT/US2017/069157 dated Sep. 28, 2018, 14 pgs.
Partial Search Report from European Patent Application No. 17936070.6, dated Jul. 5, 2021, 15 pgs.
Partial Search Report from European Patent Application No. 17936070.6, dated Oct. 6, 2021, 14 pgs.
Search Report from European Patent Application No. 17936070.6, dated Oct. 6, 2021, 14 pgs.

* cited by examiner

STACKED SILICON DIE ARCHITECTURE WITH MIXED FLIPCIP AND WIREBOND INTERCONNECT

CROSS-REFERENCE TO RELATED APPLICATION

This patent application is a U.S. National Phase Application under 35 U.S.C. § 371 of International Application No. PCT/US2017/069157, filed Dec. 30, 2017, entitled "STACKED SILICON DIE ARCHITECTURE WITH MIXED FLIPCIP AND WIREBOND INTERCONNECT," which designates the United States of America, the entire disclosure of which is hereby incorporated by reference in its entirety and for all purposes.

FIELD

Embodiments relate to packaging for stacked electronic devices. More particularly, the embodiments relate to packing solutions that include flip chip and wire bond interconnects to provide a stacked silicon die architecture.

BACKGROUND

Semiconductor devices, such as three-dimensional (3D) stacked dies, present several problems. One such problem is that the 3D stacked dies have x-height and x-y area limitations with memory on a system-on-a-chip (SoC) package-on-package (PoP) implementations.

PoP is an integrated circuit packaging technology in which a number of ball grid array (BGA) packages are arranged vertically, which ultimately increases the vertical interconnect area of the semiconductor device. Typically, PoP packaging reduces the board area occupied by individually semiconductor devices. PoP packaging also minimizes track length between components that frequently interoperate. Implementing PoP thus provides more rapid signal propagation, reduced noise, and reduced channel cross-talk. In assembly, PoP packaging permits the testing of individual components prior to chip stacking rather than after chip stacking, reducing rework since only working components are used in the PoP package.

A typical PoP integrated circuit may include a memory package that is stacked with a logic package, such as a system-on-a-chip (SoC). Frequently, the packages are stacked and then physically and conductively coupled via reflows (or reforming). Additionally, the PoP packaging enables 3D die stack packaging as memory—or some other functional component—is mounted above the two-die stack. These two packaging architectures, however, require more package surface area, and have a significantly larger z-height.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
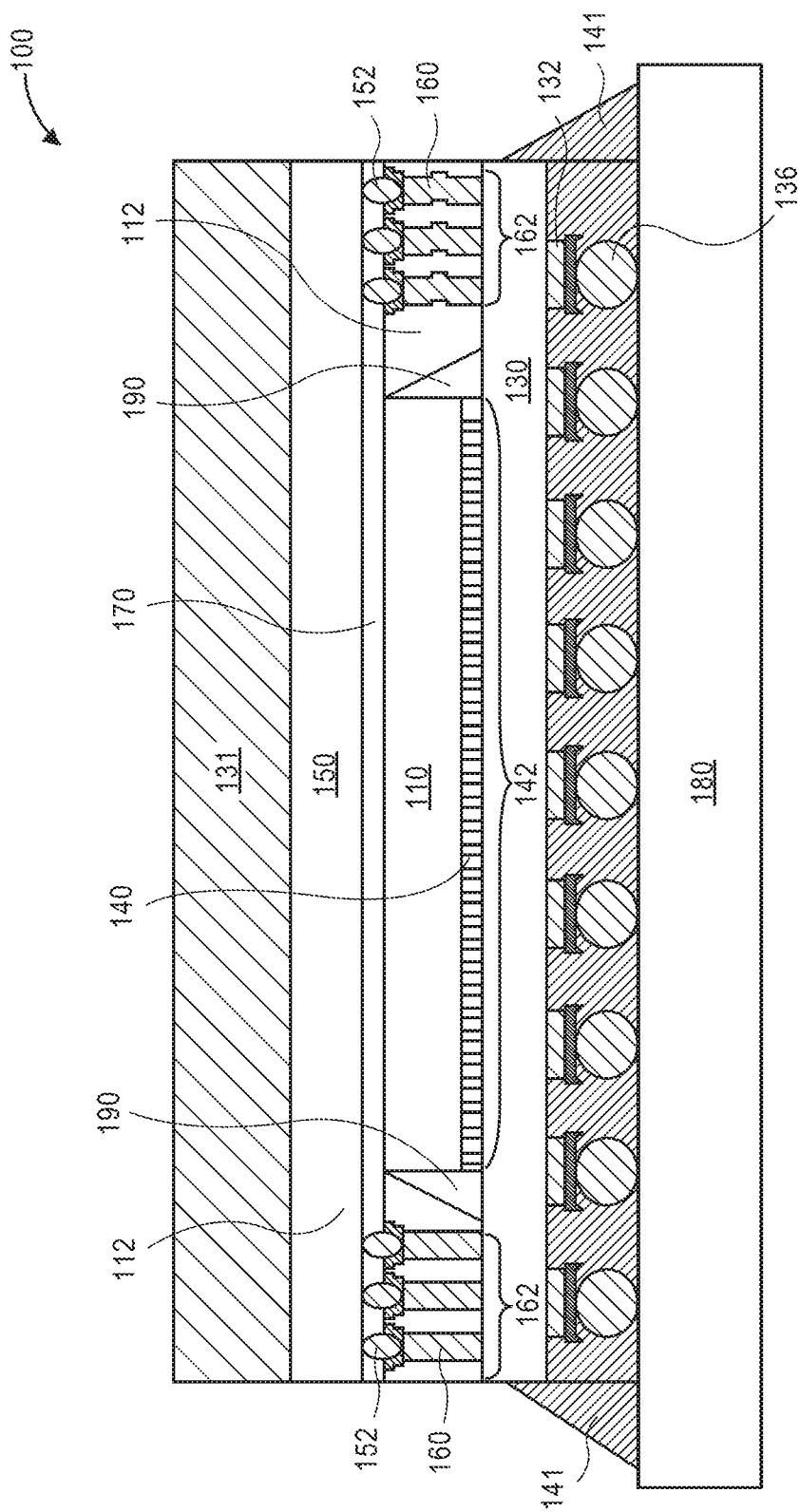
FIG. 1 is a cross-sectional view of a semiconductor package with a PoP implementation.

Described herein are systems that include a semiconductor package/device with stacked dies and interconnects and methods of forming such semiconductor packages. Specifically, a stacked semiconductor die package is described below and methods of forming such stacked semiconductor package using flip chip interconnects in combination with wire bond interconnects.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

For some embodiments, the stacked semiconductor dies (also referred to as three-dimensional (3D) stacked dies) facilitate solutions for heterogeneous integrations in semiconductor packaging. For example, when applied to system-on-a-chip (SoC) devices with memory packaged in a package-on-package (PoP) configuration, the typical resulting package thickness and footprint can exceed desired targets. As such, the embodiments described herein address the x-height and X/Y area limitations of memory on SOC package-on package (POP) architectures by (i) eliminating the need for two package constructions and (ii) reducing the overall volume of the semiconductor device with vertical interconnects that implement wire bonds instead of ball grid array (BGA) solder connections.

According to some embodiments, the 3D stacked die package described herein includes one or more dies that are vertically stacked to minimize the overall volume of the system. For one embodiment, one or more base dies are stacked on an active (or inactive) silicon interposer using flip chip (i.e., controlled collapse chip connections (C4)) interconnects. Additionally, one or more stacked dies (e.g., memory or some other functionality silicon dies) are disposed on a backside of the top stacked base die and connected to the bottom stacked base die using wire bonds, as the bottom stacked base die exceeds the area of the top stacked dies to provide one or more exposed pads to connect the wire bonds.

For one embodiment, vertically stacking the dies with wire bonds and then adding an encapsulation layer over the dies and wire bonds yields a reduced z-height of the overall semiconductor package (also referred to as semiconductor device). Embodiments of the 3D stacked die package thus help to overcome the limitations on shrinking packages associated with the z-height of BGA solder connections used to connect one or more stacked dies.

For one embodiment, a package-on-silicon (PoS) semiconductor package (e.g., a PoS semiconductor package as shown in FIG. 1) may include a first semiconductor package and a second semiconductor package that are stacked on and conductively coupled to an active silicon substrate, where the first and second semiconductor packages/devices may include one or more stacked dies. The active silicon substrate communicably couples the first semiconductor package to the second semiconductor package. For one embodiment, the active silicon substrate (or the base die) may also be disposed on and electrically coupled to an interposer, where the interposer is disposed/positioned on a substrate (e.g., a printed circuit board (PCB), a motherboard, etc.). The active silicon substrate may include a base die that is used as the base of one or more stacked semiconductor packages (or stacked dies). Typically, the second semiconductor package, which may include one or more stacked memory dies, is positioned above the first semiconductor package, and the first semiconductor package conductively couples directly to the active silicon substrate using a plurality interconnects arranged in a first pattern.

In embodiments where the footprint of the second semiconductor package extends beyond the footprint of the first semiconductor package, a plurality of conductive members (e.g., copper clad pillars) may extend between and conductively couple conductive structures arranged in a second pattern on the upper surface of the active silicon substrate to conductive structures disposed on the lower surface of the second semiconductor package. In such embodiments, the interconnect pitch (i.e., the spacing and geometric arrangement) of the first pattern may have a density greater than the interconnect pitch of the second pattern. In these embodiments, the conductive members may be formed on the surface of the active silicon substrate prior to conductively coupling the second semiconductor package to the conductive members.

In other embodiments, a plurality of wire bonds may conductively couple the second semiconductor package to the active silicon substrate (or the base die), including conductively coupling one or more stacked dies (e.g., memory dies) to the top surface of the active silicon substrate (or the base die). In such embodiments, the pads or lands disposed in a second pattern across the surface of the active silicon substrate (and/or the base die) receive each of at least some of the wire bonds conductively coupled to the second semiconductor package. The active silicon substrate may include, but is not limited to, one or more electronic components, conductors, logic devices, and/or semiconductor devices to communicably couple the first semiconductor package to the second semiconductor package. In such embodiments, the interconnect pitch of the first pattern of interconnects coupling the first semiconductor package to the active silicon substrate may have a density greater than the interconnect pitch of the second pattern of pads or similar conductive structures coupling the second semiconductor package to the active silicon substrate. In such embodiments, the pads or other conductive structures may be formed on the surface of the active silicon substrate prior to conductively coupling the second semiconductor package to the conductive members.

In other embodiments, an interposer layer may be disposed between the lower surface of the base die and the substrate (e.g., the PCB). In these embodiments, the interposer layer may be physically coupled, for example using a highly thermally conductive epoxy or an underfill layer, to the base die. The base die conductively couples to the upper surface of the interposer layer. In some implementations, conductive lands, pads, or similar structures disposed across all or a portion of the upper surface of the interposer layer may conductively couple to the base die (e.g., through silicon vias (TSVs) extending through the base die/active silicon substrate).

Accordingly, for some embodiments, the semiconductor package described herein includes a base die disposed on an interposer; a plurality of dies on top of one another to form a stack that is disposed on the base die, where each die has a top surface and a bottom surface that is opposite from the top surface, and where at least one or more of the stacked dies (i.e., the plurality of dies that are stacked on top of each other) has one or more die contacts on at least one of the top surface and the bottom surface that are electrically coupled to at least one die contact of the base die with one or more wire bonds; and a mold layer (or an encapsulation layer) disposed over and around the plurality of dies, the base die, and the one or more interconnects. For an additional embodiment, the interposer may be disposed on a substrate that includes a PCB and/or a motherboard. These embodiments allow for the plurality of dies to be disposed/stacked on top of another—without using BGA interconnects between each of the dies—and electrically coupled to the base die with the wire bonds, thus reducing the overall z-height of the semiconductor package.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1 is a cross-sectional view of a semiconductor package 100 in which a first semiconductor package 110 and a second semiconductor package 150 are stacked and conductively coupled to an active silicon substrate 130 that communicably couples the first semiconductor package 110 to the second semiconductor package 150, according to one embodiment. The first semiconductor package 110 conductively couples to an active silicon substrate 130 using a plurality of interconnects 140 disposed in a first pattern 142 across the upper surface of the active silicon substrate 130. The second semiconductor package 150 also conductively couples to the active silicon substrate 130 using a plurality of conductive structures 160 (e.g., conductive pillars) that extend from an upper surface of the active silicon substrate 130 and are disposed in a second pattern 162 across the upper surface of the active silicon substrate 130. In embodiments, the density of the first interconnect pattern 142 is greater than the density of the second interconnect pattern 162. In embodiments, the inter-interconnect distance (i.e., the distance between interconnects 140) in the first interconnect pattern 142 is less than the inter-interconnect distance (i.e., the distance between conductive structures 160) in the second interconnect pattern 162.

For one embodiment, the active silicon substrate 130 communicably couples the first semiconductor package 110 to the second semiconductor package 150. In some embodiments, lands, pads, or similar conductive elements 132 may be disposed on, across, or about all or a portion of the lower surface of the active silicon substrate 130. Conductive material, such as a conductive paste or solder balls 134 may communicably couple the active silicon substrate 130 to a substrate 180, including an underlying organic substrate such as a PCB and/or a motherboard. The active silicon substrate 130 may include any number of conductively coupled, connected, and/or configurable circuits, electrical components, conductive structures, logic elements, and/or semiconductor devices. The active silicon substrate 130 may include any number and/or combination of conductive and/or dielectric layers. The active silicon substrate 130 communicably couples the first semiconductor package 110 to the second semiconductor package 150.

According to one embodiment, the first semiconductor package 110 conductively couples to the active silicon substrate 130 using interconnects 140 arranged in a first interconnect pattern 142. In these embodiments, the lands, pads, bumps, or similar conductive elements 140 arranged in the first interconnect pattern 142 may be disposed in on, about, or across the upper surface of the active silicon substrate 130. Accordingly, the lands, pads, bumps, or similar conductive elements 140 forming the first interconnect pattern 142 may be spaced at an equal distance and/or one or more different distances based on the desired packaging design.

The second semiconductor package 150 conductively couples to the active silicon substrate using conductive members 160 arranged in a second interconnect pattern 162. For one embodiment, the conductive members 160 arranged in the second interconnect pattern 162 may be disposed in on, about, or across the upper surface of the active silicon substrate 130. In embodiments, the conductive members 160 forming the second interconnect pattern 162 may be spaced at one or more distances based on the desired packaging design. In some implementations, the conductive members 160 may be formed on, about, or across the upper surface of the active silicon substrate 130 using any current or future developed deposition technique. In some implementations, the conductive members 160 may include, but are not limited to, a copper plated member conductively coupled to the upper surface of the active silicon substrate 130. For some embodiments, the conductive members 160 may have one or more heights (i.e., may project from the upper surface of the active silicon substrate 130 a distance) based on the desired packaging design.

For one embodiment, the first semiconductor package 110 may include any number and/or combination of semiconductor dies and/or stacked semiconductor dies having a first, high density, interconnect pattern 142 disposed across all or a portion of the bottom surface of the first semiconductor package 110. In some embodiments, a plurality of microbumps 140 may provide the first interconnect pattern 142 on the bottom surface of the first semiconductor package 110. In these embodiments, the first semiconductor package 110 may include a system-on-a-chip (SoC) semiconductor package. The first semiconductor package 110 may include one or more semiconductor packages used in rack-mounted, desktop, or portable processor-based devices. In at least some implementations, one or more materials may be underflowed 190 in the space between the bottom surface of the first semiconductor package 110 and the upper surface of the active silicon substrate 130.

For one embodiment, the second semiconductor package 150 may include any number and/or combination of semiconductor dies and/or stacked semiconductor dies having a second interconnect pattern 162 disposed across all or a portion of a peripheral portion of the bottom surface of the second semiconductor package 150 that overhangs and/or extends beyond the periphery of the first semiconductor package 110. In some embodiments, the second semiconductor package 150 may include, but is not limited to: one or more memory and/or storage semiconductor packages; one or more graphics/graphical processor semiconductor packages; and/or one or more wired or wireless communications interface semiconductor packages. Additionally, according to some embodiments, the first and second semiconductor packages 110 and 150 may each include one or more dies (and/or semiconductor devices), where these one or more dies may include, but are not limited to, a semiconductor die, an integrated circuit, a CPU, a microprocessor, and a platform controller hub (PCH), a memory, and a field programmable gate array (FPGA).

As shown in FIG. 1, the lower surface of the second semiconductor package 150 may be physically affixed, coupled, and/or bonded to the upper surface of the first semiconductor package using one or more chemically active or thermosetting adhesives, such as a high thermal conductivity adhesive 170 that promotes the flow of heat upward through the PoS package.

For some embodiments, the second semiconductor package 150 may include a plurality of conductive features, such as a plurality of solder balls 152, that, when reflowed, conductively couple the second semiconductor package 150 to the conductive members 160 extending from the upper surface of the active silicon substrate. In these embodiments, a mold compound 112 may be inserted, deposited, flowed, or otherwise disposed between the lower surface of the second semiconductor package 150 and the upper surface of the active silicon substrate 130.

For additional embodiments, an underflow material 141 may be disposed between the lower surface of the active silicon substrate 130 and the upper surface of the organic substrate 180. Furthermore, a mold layer 131 (or an encapsulation layer) may be disposed above and around the first and second semiconductor packages 110 and 150, the active silicon substrate 130, and the substrate 180.

Note that semiconductor package 100 may include fewer or additional packaging components based on the desired packaging design.

Figure 2:
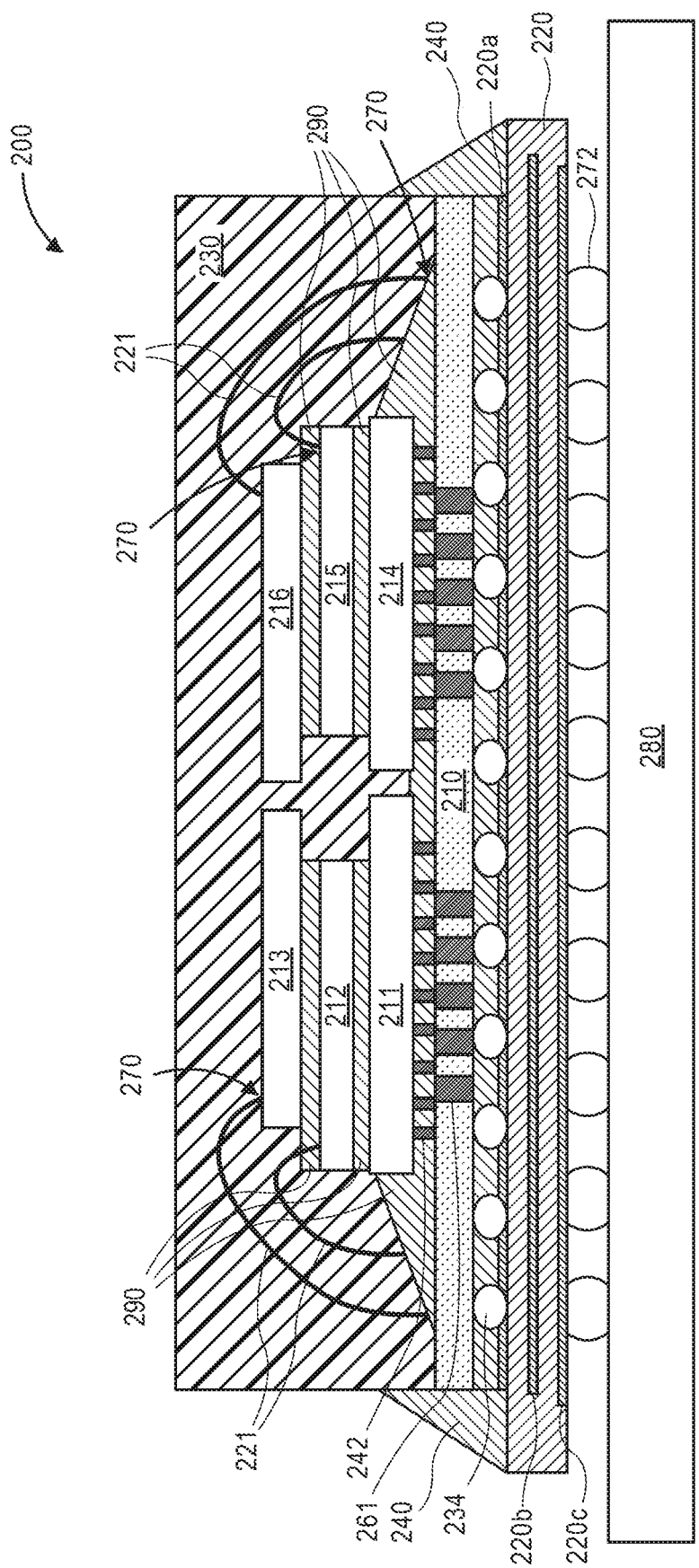
FIG. 2 is a cross-sectional view of a semiconductor package (or device) that includes a substrate, an interposer, a base die, one or more stacked dies, and wire bonds, according to one embodiment.

FIG. 2 is a cross-sectional view of a semiconductor package 200 that includes a substrate 280, an interposer 220, a base die 210, one or more stacked dies 211-216, and wire bonds 221, according to one embodiment. For some embodiments, the semiconductor package 200 of FIG. 2 may include one or more of the components of the semiconductor package 100 of FIG. 1, however the semiconductor package 200 has the one or more stacked dies 211-216 disposed on the base die 210 that are electrically coupled to the interposer 220 with the one or more wire bonds 221—without the use of BGA balls, pads, or bumps.

These embodiments facilitate packaging solutions by minimizing the z-height of the semiconductor package 200 which is vital as the consumer demand for miniaturization of consumer electronics continues to grow. As used herein, a "z-height" refers to a unit of measurement on the z-axis in a three-dimensional package, which is usually oriented vertically. For example, using the one or more wire bonds 221 to couple the stacked dies 210-216 to the interposer 220 allows for a similar z-height requirement as monolithic die packages—while taking advantage of 3D stacked die packaging. In addition, the pad area (not shown) of the wire bonds 221 requires less packaging space than BGA pads for PoP connections, thus making the package area of the semiconductor package 200 smaller than a traditional PoP.

For some embodiments, the semiconductor package 200 includes the base die 210 disposed on the interposer 220. For one embodiment, the interposer 220 may include one or more conductive layers 220a-c used to electrically couple the top surface of the interposer 220 to the base die 210, and the bottom surface of the interposer 220 to the substrate 280. For example, the base die 210 may have a plurality of solder balls 234 that electrically couple the base die 210 to the conductive layer 220a of the interposer 220. The interposer layer 220 may include a plurality of conductive features, such as a plurality of solder balls 234, that, when reflowed, conductively couple the interposer layer 220 (and, hence, the base die 210) to the top surface of the substrate 280 with a plurality of solder balls 272.

For some embodiments, the interposer 220 includes an organic pitch redistribution layer 220b sandwiched between a top conductive layer 220a that has the conductive features 234 used to conductively couple the interposer layer 220 to the base die 210, and a bottom conductive layer 220c that has the plurality of solder balls 272 used to conductively couple the interposer layer 220 to the substrate 280. As shown in FIG. 2, the top surface of the interposer layer 220 may be disposed (covered/surrounded) with an underfill layer 240, thereby surrounding the conductive features 234 and the top conductive layer 220a of the interposer 220. Note that a portion of the mold layer 230 may also be disposed on portion(s) of the top surface of the interposer 220.

For some embodiments, a plurality of dies 211-216 (or the one or more stacked dies) are disposed on top of one another to form a stack on the base die 210. Each die 210-216 has a top surface and a bottom surface that is opposite from the top surface. Additionally, each of the stacked dies 211-216 has one or more die contacts 270 on at least one of the top surface and the bottom surface that are each electrically coupled to at least one die contact 270 of the base die 210 with the one or more wire bonds 221.

Furthermore, the mold layer 230 (or an encapsulation layer) may be disposed over and around the plurality of stacked dies 211-216, the base die 210, and the one or more wire bonds 221. According to some embodiments, the interposer 220 may be disposed on the substrate 280, which may include a PCB and/or a motherboard. These embodiments allow for the plurality of dies 211-216 to be disposed/stacked on top of another without using BGA interconnects between each of the dies 211-216—and electrically coupled to the base die 210 and the interposer 220 with the wire bonds 221, reducing the overall z-height of the semiconductor package 200.

According to some embodiments, the substrate 280 may include, but is not limited to, a package, a substrate, a PCB, and a motherboard. For one embodiment, the substrate 280 is a PCB. For one embodiment, the PCB is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown). For some embodiments, holes (not shown) may be drilled in substrate 280. For one embodiment, the substrate 280 may also include conductive copper traces, metallic pads, and holes (not shown).

For one embodiment, each of the one or more dies 210-216 includes, but is not limited to, a semiconductor die, an electronic device (e.g., a wireless device), an integrated circuit, a CPU, a microprocessor, a PCH, a memory, and a FPGA. Note that each of the dies 210-216 may be similar dies or differ in size (e.g., having varying z-heights or areas). For several embodiments, the one or more stacked dies 210-216 are formed of semiconductor components/devices (i.e., no discrete devices such as capacitors or inductors) to minimize the overall volume of the package. Note that, according to alternate embodiments, not all of the dies in the stack have to be active semiconductor components/devices (i.e., some dies or layers may be organic substrates, exclusively passive devices (e.g., decoupling capacitors/power delivery inductors, antennas), micro-electromechanical systems (MEMS), or other types of components and/or sensors).

Additionally, the total number of dies or devices for each package (e.g., the semiconductor package 200) is not limited to a specific number of dies (i.e., a package can have Nth number of dies based on a design or customer requirements). For alternative embodiments, a plurality of dies may be vertically stacked to minimize the overall volume and z-height, but the plurality of dies may also be arranged in any specified orientation to have any other desired configuration. In addition, the stacked dies 211-216 may be directly disposed on another die with an underfill layer 290 or an adhesive layer (e.g., a bond film, a one/double sided tape, an attach film, an electrically conductive attach film, an epoxy film, etc.).

For some embodiments, the wire bonds 221 electrically couple the one or more die contacts 270 of the one or more stacked dies 211-216 to the base die 210 and the interposer 220. For one embodiment, the wire bond interconnects 221 of the semiconductor package 200 as shown in FIG. 2 may be substantially similar to those presently known in the art. For example, the wire bonds 221 may be wires that are ball-stitch bonded or wedge bonded from at least a wire bond pad 270 on the top surface of one stacked die(s) 211-216 to a surface of the base die 210 and the interposer 220.

In addition, the wire bonds 221 may be any commonly used conductive material, such as copper, silver, gold, or alloys thereof. While wire-bonded semiconductor dies are illustrated in FIG. 2, it is to be appreciated that the semiconductor dies are not limited to wire bonding, and other interconnect structures, such as flip-chip, 3D printing, inkjet, and anisotropic conductive film (ACF), which may also be within the scope of embodiments.

Additionally, the base die 210 may be electrically coupled to dies 211 and 214 with a plurality of interconnects 261, such as through silicon vias (TSVs)). For one embodiment, the dies 211 and 214 may be conductively coupled to the base die 210 with the plurality of interconnects 261, which are disposed between the top surface of the base die 210 and the bottom surfaces of dies 211 and 214. In some embodiments, the plurality of interconnects 261 may include one or more C4 bumps (or micro bumps) to electrically couple the base die 210 and the dies 211 and 214. The plurality of interconnects 261 may be surrounded by the underfill layer (or material(s)) 290 that is underflowed in the space between the bottom surfaces of dies 211 and 214 and the top surface of the base die 210.

According to one embodiment, the die contacts 270 (also referred to as die contact pads, interconnects pads or wire bond pads) may include a conductive stack of materials, such as, but not limited to adhesion promoters, seed layers, copper, silver, gold, or alloys thereof, and oxidation inhibitors. Each of the die contacts 270 is electrically coupled to another die contact 270 with a wire bond 221 (or an interconnect line). According to some embodiments, the one or more wire bonds 221 are formed in a cascading pattern in order to allow for the wire bonds to have flexibility, particularly in flexibility to change interconnect locations and avoid bending and damage.

In addition, after the dies 210-216 are stacked and interconnected, the mold layer 230 is deposited over and around the dies 210-216, the underfill layers 290, and the wire bonds 221 to protect the semiconductor package 200 from the environment. For one embodiment, the mold layer 230 is then cured after the deposition (or overmolding). Note that the mold layer 230 may help to protect and cover the semiconductor package 200 from humidity, photons, corrosion and damage. According to one embodiment, a semiconductor package (e.g., semiconductor package 200) may have more than one mold layer(s) based on the stacked systems or dies that may require different molding/encapsulation requirements.

For one embodiment, the mold layer 230 is made of an epoxy (e.g., a soft epoxy, a stiff epoxy, opaque epoxy, etc.) with one or more filler materials. According to some embodiments, the one or more materials for the mold layer 230 include, but are not limited to, ultra-compliant materials for semiconductor devices, pressure sensors, visible light, ultraviolet (UV) and infrared (IR) absorbing/reflective materials to block photons from the dies, stiff polymers to encapsulate the interconnects and/or wire bonds, and/or transparent materials on an energy harvest (e.g., a solar cell). In addition, the one or more mold materials may also include visible light, UV and/or IR blocking agents or metals (e.g., aluminum to block light) that are selectively sputtered or deposited on the package. For some embodiments, the mold layer 230 may be formed with one or more encapsulant materials that are dispensed onto the package (e.g., semiconductor package 200), rather than using injection, compression, or transfer mold processes.

For other embodiments, the mold layer 230 may be a rectangular enclosure or have any arbitrary shape/texture to enable the desired packaging design or application, including hemispherical shape, a capsule-like shape, a honeycombed shape to increase surface area, a round shape, one or more dimples to fit in certain devices, etc. For additional embodiments, an underflow layer 240 may be disposed between the lower surface of the mold layer 230 and the base die 210 and the top surface of the interposer 220.

As illustrated in FIG. 2, the semiconductor package 200 one or more stacked dies 210-216 (or the 3D stacked dies) that are coupled with at least one of a plurality of interconnects 242 (e.g., flip chip/C4 bumps) and a plurality of wire bonds 221, rather than having a plurality of BGA interconnects (or bumps/ball) to increase the z-height of the overall semiconductor package 200. Having the z-height of the semiconductor package 200, including the z-height of 3D stacked dies 210-216, mitigated with the combination of the flip chip and wire bond interconnects (e.g., interconnects 242 and 221) is advantageous because no additional assembly or part(s) is required, and as such the manufacturing complexity and uncertainty is drastically reduced.

For certain embodiments, the implementation of combining the flip chip and wire bond interconnects (e.g., interconnects 242 and 221) is even more suitable for smaller form factors as the dimensions of the semiconductor packages, devices, and interconnects keep shrinking. Likewise, the implementation of combining the flip chip and wire bond interconnects (e.g., interconnects 242 and 221) also reduces the bill of materials (BoM) cost and the X/Y area limitations associated with BGA packages.

Note that the semiconductor package 200 may include fewer or additional packaging components based on the desired packaging design.

Figure 3:
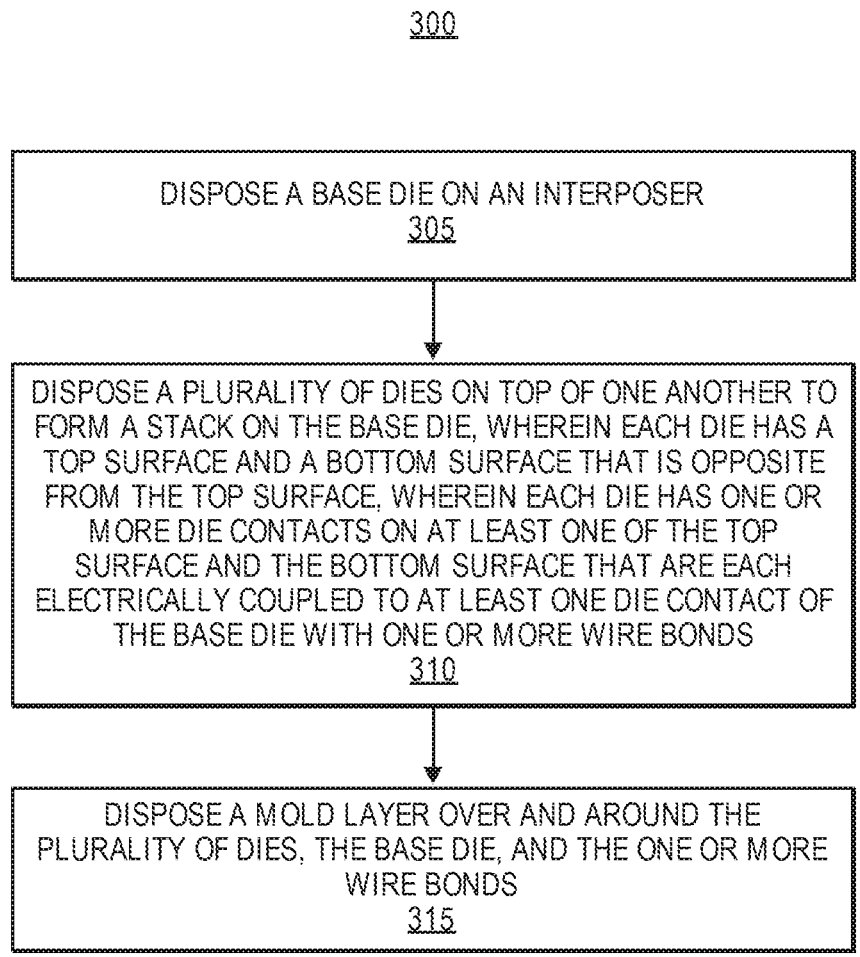
FIG. 3 is a process flow illustrating a method of a semiconductor package that includes a substrate, an interposer, a base die, one or more stacked dies, and wire bonds, according to one embodiment.

FIG. 3 is a process flow 300 illustrating a method of a semiconductor package that includes a substrate, an interposer, a base die, one or more stacked dies, and wire bonds, according to one embodiment. For one embodiment, the process flow 300 includes one or more steps used to form the semiconductor packages as described herein (e.g., the semiconductor package 200 of FIG. 2).

At block 305, the process flow 300 disposes a base die on an interposer (e.g., as shown in FIG. 2). At block 310, the process flow 300 disposes a plurality of dies on top of one another to form a stack on the base die, where each die has a top surface and a bottom surface that is opposite from the top surface, and where at least one or more of the stacked dies has one or more die contacts on at least one of the top surface and the bottom surface that are electrically coupled to at least one die contact of the base die with one or more wire bonds (e.g., as shown in FIG. 2). At block 315, the process flow 300 disposes a mold layer over and around the plurality of dies, the base die, and the one or more wire bonds (e.g., as shown in FIG. 2).

For additional embodiments, the process flow may include the base die having a first surface area that exceeds a second surface area of the plurality of stacked dies. For example, the first surface areas may allow/afford the second area of the one or more stacked dies to be disposed above the first surface area of the base die, while also leaving a portion of the first surface area to couple the wire bonds from the one or more stacked dies. For example, as shown in FIG. 2, the second surface area may include the bottom surface areas of dies 211 and 214 which is smaller than the top surface area of the base die 210.

For other embodiments, the process flow may also include the base die having a plurality of interconnects (e.g., a plurality of interconnects 261 of FIG. 2) that electrically couple at least one or more of the plurality of stacked dies to the interposer. The process flow further includes at least one or more of the plurality of stacked dies electrically coupled to the base die with a plurality of C4 bumps (e.g., a plurality of interconnects 242 of FIG. 2). The process flow also may form the mold layer to include one or more different shapes, such as a rectangular shape, a hemispherical shape, a capsule-like shape, a honeycombed shape, a round shape, and a dimple shape.

For additional embodiments, the process flow may have each of the plurality of stacked dies coupled to another stacked die using an underfill layer (e.g., an underfill layer 290 of FIG. 2), and wherein the underfill layer (e.g., an underfill layer 240 of FIG. 2) is further disposed on a top surface of the interposer. Note that the underfill layer may include the same materials (i.e., the underfill layers 240 and 290 of FIG. 2 may be the same material layers), or one or more different materials (i.e., the underfill layers 240 and 290 of FIG. 2 may be of different material layers).

For other embodiments, the process flow may also include disposing a substrate below the interposer, where the interposer is electrically coupled to the substrate using a plurality of solder balls (e.g., the plurality of solder balls 272 of FIG.

2). The process flow may also form the substrate to be a printed circuit board and/or a motherboard. Additionally, the process flow may include that at least one or more of the plurality of stacked dies is a memory die.

Figure 4:
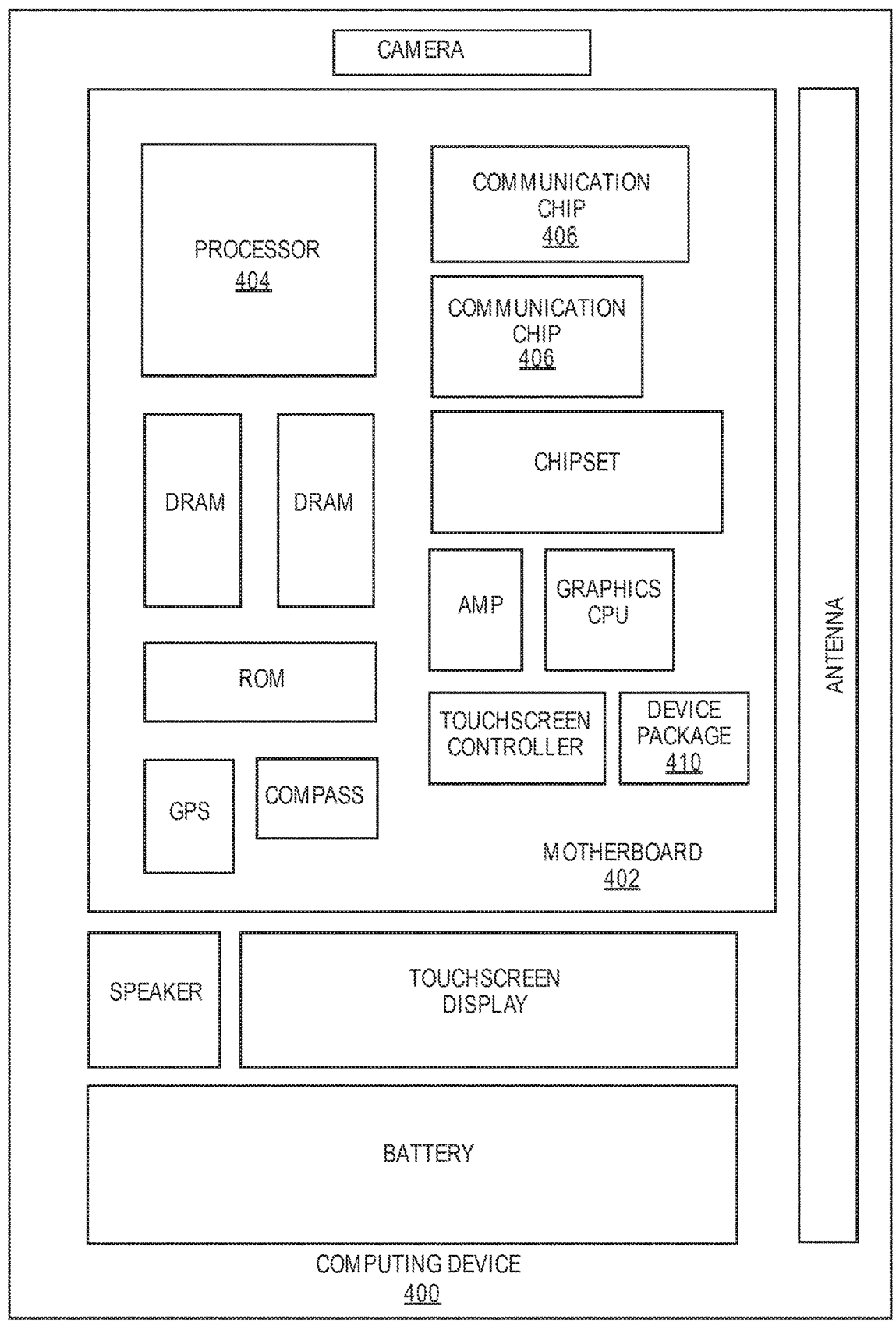
FIG. 4 is a schematic block diagram illustrating a computer system that utilizes a semiconductor package (or device) with a substrate, an interposer, a base die, one or more stacked dies, and wire bonds, according to one embodiment.

Note that the semiconductor package formed by process flow 300 may include fewer or additional packaging components based on the desired packaging design (e.g., as shown in FIGS. 1, 2, and 4).

FIG. 4 is a schematic block diagram illustrating a computer system that utilizes a device package with one or more stacked dies, one or more wire bonds, a base die, a mold layer, an interposer, and a substrate, as described herein. FIG. 4 illustrates an example of computing device 400. Computing device 400 houses motherboard 402. For one embodiment, motherboard 402 may be similar to the motherboard of Figures of 1-2 (e.g., substrate 180 and 280 of FIGS. 1-2). Motherboard 402 may include a number of components, including but not limited to processor 404, semiconductor package 410 (or semiconductor device), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be, but is not limited to, a packaging substrate and/or a printed circuit board. Device package 410 with one or more stacked dies, one or more wire bonds, a base die, a mold layer, an interposer, and a substrate (as illustrated in FIGS. 1-2)—or any other components from the figures described herein—of the computing device 400. Further, the device package 410 may reduce the z-height of the computing device 400 (e.g., 1 mm to 0.8 mm of a typical PoP configuration—in addition the package footprint may be reduced from roughly ~14×14 to 12×12 which is roughly a 30% reduction in overall volume).

Note that device package 410 may be a single component/device, a subset of components, and/or an entire system, as the materials, features, and components may be limited to device package 410 and/or any other component that requires 3D stacked dies on the base die connected by wire bonds.

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising a base die on an interposer; a plurality of dies on top of one another to form a stack on the base die, wherein each die has a top surface and a bottom surface that is opposite from the top surface, wherein each die has one or more die contacts on at least one of the top surface and the bottom surface that are each electrically coupled to at least one die contact of the base die with one or more wire bonds; and a mold layer disposed over and around the plurality of dies, the base die, and the one or more wire bonds.

In Example 2, the subject matter of example 1 can optionally include a base die that has a first surface area that exceeds a second surface area of the plurality of stacked dies.

In Example 3, the subject matter of any of examples 1-2 can optionally include a base die that has a plurality of interconnects that electrically couple at least one or more of the plurality of stacked dies to the interposer.

In Example 4, the subject matter of any of examples 1-3 can optionally include at least one or more of the plurality of stacked dies electrically coupled to the base die with a plurality of controlled collapse chip connection (C4) bumps.

In Example 5, the subject matter of any of examples 1-4 can optionally include the mold layer that has one or more different shapes, including a rectangular shape, a hemispherical shape, a capsule-like shape, a honeycombed shape, a round shape, and a dimple shape.

In Example 6, the subject matter of any of examples 1-5 can optionally include each of the plurality of stacked dies coupled to another stacked die using an underfill layer. The underfill layer is further disposed on a top surface of the interposer.

In Example 7, the subject matter of any of examples 1-6 can optionally include further comprising a substrate disposed below the interposer. The interposer is electrically coupled to the substrate using a plurality of solder balls.

In Example 8, the subject matter of any of examples 1-7 can optionally include the substrate as a printed circuit board.

In Example 9, the subject matter of any of examples 1-8 can optionally include at least one or more of the plurality of stacked dies is a memory die.

Example 10 is a method of forming a semiconductor package comprising disposing a base die on an interposer; disposing a plurality of dies on top of one another to form a stack on the base die, wherein each die has a top surface and a bottom surface that is opposite from the top surface, wherein each die has one or more die contacts on at least one of the top surface and the bottom surface that are each electrically coupled to at least one die contact of the base die with one or more wire bonds; and disposing a mold layer over and around the plurality of dies, the base die, and the one or more wire bonds.

In Example 11, the subject matter of example 10 can optionally include the base die that has a first surface area that exceeds a second surface area of the plurality of stacked dies.

In Example 12, the subject matter of any of examples 10-11 can optionally include the base die that has a plurality of interconnects that electrically couple at least one or more of the plurality of stacked dies to the interposer.

In Example 13, the subject matter of any of examples 10-12 can optionally include at least one or more of the plurality of stacked dies are electrically coupled to the base die with a plurality of C4 bumps.

In Example 14, the subject matter of any of examples 10-13 can optionally include the mold layer that has one or more different shapes, including a rectangular shape, a hemispherical shape, a capsule-like shape, a honeycombed shape, a round shape, and a dimple shape.

In Example 15, the subject matter of any of examples 10-14 can optionally include each of the plurality of stacked dies coupled to another stacked die using an underfill layer. The underfill layer is further disposed on a top surface of the interposer.

In Example 16, the subject matter of any of examples 10-15 can optionally include further comprising disposing a substrate below the interposer. The interposer is electrically coupled to the substrate using a plurality of solder balls.

In Example 17, the subject matter of any of examples 10-16 can optionally include the substrate as a printed circuit board.

In Example 18, the subject matter of any of examples 10-17 can optionally include at least one or more of the plurality of stacked dies is a memory die.

Example 19 is a semiconductor package, comprising an interposer on a substrate; a base die on the interposer; a plurality of dies on top of one another to form a stack on the base die, wherein each die has a top surface and a bottom surface that is opposite from the top surface, wherein each die has one or more die contacts on at least one of the top surface and the bottom surface that are each electrically coupled to at least one die contact of the base die with one or more wire bonds, wherein at least one or more of the plurality of stacked dies are electrically coupled to the base die with a plurality of C4 bumps; and a mold layer disposed over and around the plurality of dies, the base die, and the one or more wire bonds.

In Example 20, the subject matter of example 19 can optionally include the base die that has a first surface area that exceeds a second surface area of the plurality of stacked dies.

In Example 21, the subject matter of any of examples 19-20 can optionally include the base die that has a plurality of interconnects that electrically couple at least one or more of the plurality of stacked dies to the interposer.

In Example 22, the subject matter of any of examples 19-21 can optionally include the interposer that is electrically coupled to the substrate using a plurality of solder balls.

In Example 23, the subject matter of any of examples 19-22 can optionally include the mold layer that has one or more different shapes, including a rectangular shape, a hemispherical shape, a capsule-like shape, a honeycombed shape, a round shape, and a dimple shape.

In Example 24, the subject matter of any of examples 19-23 can optionally include each of the plurality of stacked dies coupled to another stacked die using an underfill layer. The underfill layer is further disposed on a top surface of the interposer.

In Example 25, the subject matter of any of examples 19-24 can optionally include the substrate as a printed circuit board. At least one or more of the plurality of stacked dies is a memory die.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a base die on an interposer, wherein the base die is a semiconductor die including active semiconductor devices, the base die comprising a plurality of through silicon vias;
   a plurality of dies on top of one another to form a stack on the base die, wherein each die has a top surface and a bottom surface that is opposite from the top surface, wherein at least one or more of the stacked dies has one or more die contacts on at least one of the top surface or the bottom surface that are electrically coupled to at least one die contact of the base die with one or more wire bonds; and
   a mold layer disposed over and around the plurality of dies, the base die, and the one or more wire bonds.

2. The semiconductor package of claim 1, wherein the base die has a first surface area that exceeds a second surface area of the plurality of stacked dies.

3. The semiconductor package of claim 1, wherein the base die has a plurality of interconnects that electrically couple at least one or more of the plurality of stacked dies to the interposer.

4. The semiconductor package of claim 1, wherein at least one or more of the plurality of stacked dies are electrically coupled to the base die with a plurality of controlled collapse chip connection (C4) bumps.

5. The semiconductor package of claim 1, wherein the mold layer has a rectangular shape.

6. The semiconductor package of claim 1, wherein each of the plurality of stacked dies is coupled to another stacked die using an underfill layer, and wherein the underfill layer is further disposed on a top surface of the interposer.

7. The semiconductor package of claim 1, further comprising a substrate disposed below the interposer, wherein the interposer is electrically coupled to the substrate using a plurality of solder balls.

8. The semiconductor package of claim 7, wherein the substrate is a printed circuit board.

9. The semiconductor package of claim 1, wherein at least one or more of the plurality of stacked dies is a memory die.

10. A method of forming a semiconductor package, comprising:
disposing a base die on an interposer, wherein the base die is a semiconductor die including active semiconductor devices, the base die comprising a plurality of through silicon vias;
disposing a plurality of dies on top of one another to form a stack on the base die, wherein each die has a top surface and a bottom surface that is opposite from the top surface, wherein at least one or more of the stacked dies has one or more die contacts on at least one of the top surface or the bottom surface that are electrically coupled to at least one die contact of the base die with one or more wire bonds; and
disposing a mold layer over and around the plurality of dies, the base die, and the one or more wire bonds.

11. The method of claim 10, wherein the base die has a first surface area that exceeds a second surface area of the plurality of stacked dies.

12. The method of claim 10, wherein the base die has a plurality of interconnects that electrically couple at least one or more of the plurality of stacked dies to the interposer.

13. The method of claim 10, wherein at least one or more of the plurality of stacked dies are electrically coupled to the base die with a plurality of C4 bumps.

14. The method of claim 10, wherein the mold layer has a rectangular shape.

15. The method of claim 10, wherein each of the plurality of stacked dies is coupled to another stacked die using an underfill layer, and wherein the underfill layer is further disposed on a top surface of the interposer.

16. The method of claim 10, further comprising disposing a substrate below the interposer, wherein the interposer is electrically coupled to the substrate using a plurality of solder balls.

17. The method of claim 16, wherein the substrate is a printed circuit board.

18. The method of claim 10, wherein at least one or more of the plurality of stacked dies is a memory die.

19. A semiconductor package, comprising:
an interposer on a substrate;
a base die on the interposer, the base die comprising a plurality of through silicon vias;
a plurality of dies on top of one another to form a stack on the base die, wherein each die has a top surface and a bottom surface that is opposite from the top surface, wherein at least one or more of the stacked dies has one or more die contacts on at least one of the top surface or the bottom surface that are electrically coupled to at least one die contact of the base die with one or more wire bonds, wherein at least one or more of the plurality of stacked dies are electrically coupled to the base die with a plurality of C4 bumps; and
a mold layer disposed over and around the plurality of dies, the base die, and the one or more wire bonds.

20. The semiconductor package of claim 19, wherein the base die has a first surface area that exceeds a second surface area of the plurality of stacked dies.

21. The semiconductor package of claim 19, wherein the base die has a plurality of interconnects that electrically couple at least one or more of the plurality of stacked dies to the interposer.

22. The semiconductor package of claim 19, wherein the interposer is electrically coupled to the substrate using a plurality of solder balls.

23. The semiconductor package of claim 19, wherein the mold layer has a rectangular shape.

24. The semiconductor package of claim 19, wherein each of the plurality of stacked dies is coupled to another stacked die using an underfill layer, and wherein the underfill layer is further disposed on a top surface of the interposer.

25. The semiconductor package of claim 19, wherein the substrate is a printed circuit board, and wherein at least one or more of the plurality of stacked dies is a memory die.

26. A semiconductor package, comprising:
a base die on an interposer, the base die comprising a plurality of through silicon vias;
a plurality of dies on top of one another to form a stack on the base die, wherein each die has a top surface and a bottom surface that is opposite from the top surface, wherein at least one or more of the stacked dies has one or more die contacts on at least one of the top surface or the bottom surface that are electrically coupled to at least one die contact of the base die with one or more wire bonds, wherein at least one or more of the plurality of stacked dies are electrically coupled to the base die with a plurality of controlled collapse chip connection (C4) bumps; and
a mold layer disposed over and around the plurality of dies, the base die, and the one or more wire bonds.

27. A semiconductor package, comprising:
a base die on an interposer, the base die comprising a plurality of through silicon vias;
a plurality of dies on top of one another to form a stack on the base die, wherein each die has a top surface and a bottom surface that is opposite from the top surface, wherein at least one or more of the stacked dies has one or more die contacts on at least one of the top surface or the bottom surface that are electrically coupled to at least one die contact of the base die with one or more wire bonds, wherein each of the plurality of stacked dies is coupled to another stacked die using an underfill layer, and wherein the underfill layer is further disposed on a top surface of the interposer; and
a mold layer disposed over and around the plurality of dies, the base die, and the one or more wire bonds.

* * * * *